(12) United States Patent
De Lima Filho

(10) Patent No.: US 7,586,367 B2
(45) Date of Patent: Sep. 8, 2009

(54) CURRENT SENSOR DEVICE

(75) Inventor: Jader Alves De Lima Filho, Campinas (BR)

(73) Assignee: Freescale Semiconductor, Inc., Austin, TX (US)

( * ) Notice: Subject to any disclaimer, the term of this patent is extended or adjusted under 35 U.S.C. 154(b) by 245 days.

(21) Appl. No.: 11/739,933

(22) Filed: Apr. 25, 2007

(65) Prior Publication Data

US 2008/0265850 A1    Oct. 30, 2008

(51) Int. Cl.
    G06F 7/12    (2006.01)
(52) U.S. Cl. ...................................... 327/562
(58) Field of Classification Search ................. 327/561, 327/562, 89; 330/69, 258
    See application file for complete search history.

(56) References Cited

U.S. PATENT DOCUMENTS

| | | | |
|---|---|---|---|
| 5,081,379 | A | 1/1992 | Korteling |
| 5,982,160 | A | 11/1999 | Walters et al. |
| 6,160,388 | A | 12/2000 | Skelton et al. |
| 6,166,528 | A | 12/2000 | Rossetti et al. |
| 6,219,262 | B1 | 4/2001 | Burgyan |
| 6,246,220 | B1 | 6/2001 | Isham et al. |
| 6,316,922 | B1 * | 11/2001 | Sugahara et al. ............. 323/224 |
| 6,377,034 | B1 | 4/2002 | Ivanov |
| 6,441,597 | B1 | 8/2002 | Lethellier |
| 6,717,389 | B1 | 4/2004 | Johnson |
| 6,867,647 | B2 * | 3/2005 | Wouters ....................... 330/69 |
| 7,459,894 | B2 * | 12/2008 | Li et al. ....................... 323/285 |

OTHER PUBLICATIONS

Mammano, B.; "Current Sensing Solutions for Power Supply Designers"; Unitrode Seminar Notes SEM1200; 1999.
Yang, J. and Hua, L.; "Analysis and Design Consideration of Using Current Sensing Transformer in Forward Converter with Synchronous Rectification"; Proc. of IEEE APEC; vol. 2; pp. 878-882; 2004.
Liu, Y. and Jain, P.; "A New Current Sensing Scheme for Zero-Voltage Switching Phase-Shifted Bridge Converter"; Proc. of Telecommunications Energy Conference; pp. 567-573; 2000.
Forghani-Zadeh, H.P. And Rincon-Mora, G.A.; "Current-Sensing Techniques for DC-DC Converters"; Proc. of IEEE MWSCAS; pp. 557-580; vol. 2; Aug. 2002.
Chen, J., Lin, Y., Lin, H., Su, J., Chung, W., Hwang, Y., and Tseng, C.; "On-Chip Current Sensing Technique for Hysteresis Current Controlled DC-DC Converter"; Elec. Letters; vol. 41; No. 2; 2005.

(Continued)

*Primary Examiner*—Shawn Riley

(57) ABSTRACT

A current sensor senses the current at a sense transistor and generates an output current that is an accurate proportional representation of the current at the sense transistor. Furthermore, the sensed current is relatively independent of the resistive load of the feedback path at feedback control module to which it is applied. In one embodiment, the feedback control module uses the sensed current in a DC-DC voltage converter to regulate a voltage. The current sensor employs a pair of operational amplifiers to match a voltage at a current electrode of a transistor that generates the output current to a voltage at a current electrode of the sense transistor, such that an effective resistance of the transistor generating the output current is significantly higher than the resistive load of the feedback control module, thereby ensuring that the output current is relatively independent of the resistive load of the feedback control module.

20 Claims, 2 Drawing Sheets

OTHER PUBLICATIONS

Yuvarajan, S. and Wang, L.; "Performance Analysis and Signal Processing in a Current Sensing Power" MOSFET (SENSEFET); Proc. of IEEE Industry Applications Society Annual Meeting; vol. 2; pp. 1445-1450; 1991.

Grant, D.A. and Williams, R.; "Current Sensing MOSFETs for Protection and Control"; Proc. of the IEEE Colloquium on Measurement Techniques for Power Electronics; pp. 8/1-8/5; 1992.

Kudoh, M., Hoshi, Y., Momota, S., Fujihira, T. and Sakurai, K.; "Current Sensing IGBT for Future Intelligent Power Module", Proc. of Power Semiconductor Devices and ICs; pp. 303-306; 1996.

Ohme, B. and Larson, M.; "Control Circuit Design for High Temperature Linear Regulators"; Proc. of High Temperature Electronics Conference; pp. 45-50; 1998.

Xiao, Y., Cao, J. and Spring, K.; "Current Sensing Trench Power MOSFET for Automotive Applications"; IEEE Proc. of APEC; vol. 2; pp. 766-770; 2005.

Leung, C., Mok, P. and Leung, K.; "A 1.2-V Buck Converter with a Novel On-Chip Low-Voltage Current-Sensing Scheme"; Proc. of IEEE ISCAS; vol. 5, pp. 824-827; 2004.

Zhang, Y., Zane, R., Prodic, A., Erickson, R. and Maksimovic, D.; "Online Calibration of MOSFET On-State Resistance for Precise Current Sensing"; IEEE Trans. Power Electronics Letters; vol. 2; pp. 100-103; Sept. 2004.

Sun, J., Zhou, J., Xu, M. and Lee, F.; "A Novel Input-Side Current Sensing Method to Achieve AVP for Future VRs"; Proc. of IEEE APEC; vol. 1; pp. 287-293; 2005.

Tokura, N., Yamamoto, T. and Hara, K.; "On-Chip New Current Sensing Technology with High Accuracy Using Field Effect Resistance for Intelligent Power MOSFETs"; Proc. Int. Symp. on Power Semic. Devices and Ics; pp. 160-161; 1992.

Chen, J., Su, J., Lin, H., Chang, C., Lee, Y., Chen, T., Wang, H., Chang, K., and Lin, P.; "Integrated Current Sensing Circuits Suitable for Step-Down DC-DC Converters"; Elec. Letters; vol. 40; No. 3; 2004.

Dallago, E., Passoni, M., and Sassone, G.; "Lossless Current Sensing in Low-Voltage High-Current DC/DC Modular Supplies"; IEEE Trans. on Industrial Electronics; vol. 47; pp. 1249-1252; Dec. 2000.

Zhou, X., Xu, P. and Lee, F.; "A Novel Current-Sharing Control Technique for Low-Voltage High-Current Voltage Regulator Module Applications"; IEEE Trans. Power Electron; vol. 15; pp. 1153-1162.

Chang, C.; "Combined Lossless Current Sensing for Current Mode Control"; Proc. of IEEE APEC; vol. 1; pp. 404-410; 2004.

Lee, C. and Mok, P.; "On-Chip Current Sensing Technique for CMOS Monolithic Swith-Mode Power Converters"; IEEE Proc. of ISCAS; pp. 265-268; May 2002.

Givelin, P., Bafleur, M., Tounier, E., Laopoulos, T. and Siskos, S.; "Application of a CMOS Current Mode Approach to On-Chip Current Sensing in Smart Power Circuits", IEEE Proc. Circuits Devices Syst.; vol. 142; pp. 357-363; Dec. 1995.

Nordholt, E.H.; "Extending Opamp Capabilities by Using Power-Supply"; IEEE Trans. Circuits and Systems; vol. 29; pp. 411-414; Jun. 1982.

Su, W.J., Lidgey, F.J., Porta, S. and Zhu, Q.S.; "Analysis of IC Op-Amp Power-Supply Current Sensing"; Proc. of IEEE ISCAS; pp. 541-544; vol. 5; 1994.

* cited by examiner

CURRENT SENSOR DEVICE

FIELD OF THE DISCLOSURE

The present disclosure relates to electronic circuits, and more particularly to current sensors.

BACKGROUND

Current sensing is sometimes used in feedback control loops to regulate operation of a circuit. For example, voltage regulators, such as DC-DC converters, often use current feedback control, whereby a signal based on the sensed current of the DC-DC converter output is used to ensure that the voltage applied at the output remains regulated within specified limits. Current can be sensed based on a current or a voltage. Current sensing based on a voltage is referred to as voltage-mode current sensing. A typical voltage-mode current sensing technique is to insert a sense resistor along the path of the current to be sensed to obtain a voltage signal. However, this voltage-mode current sensing technique can be undesirable, particularly in high-current applications, due to the power consumption caused by the sense resistor.

Current sensing based on a current is referred to as current-mode current sensing. A drawback of current-mode current sensing techniques is that the level of the sensed current can be affected by the resistive load of the feedback path, thereby limiting the accuracy of the current sensing. Accordingly, there is a need for an improved current sensing technique.

DETAILED DESCRIPTION

A current sensor is disclosed that senses the current at a sense transistor and generates an output current that is an accurate proportional representation of the current at the sense transistor. Furthermore, the sensed current is relatively independent of the resistive load of the feedback path at feedback control module to which it is applied. In one embodiment, the feedback control module uses the sensed current in a DC-DC voltage converter to regulate a voltage. The current sensor employs a pair of operational amplifiers to match a voltage at a current electrode of a transistor that generates the output current to a voltage at a current electrode of the sense transistor, such that an effective resistance of the transistor generating the output current is significantly higher than the resistive load of the feedback control module, thereby ensuring that the output current is relatively independent of the resistive load of the feedback control module.

Figure 1:
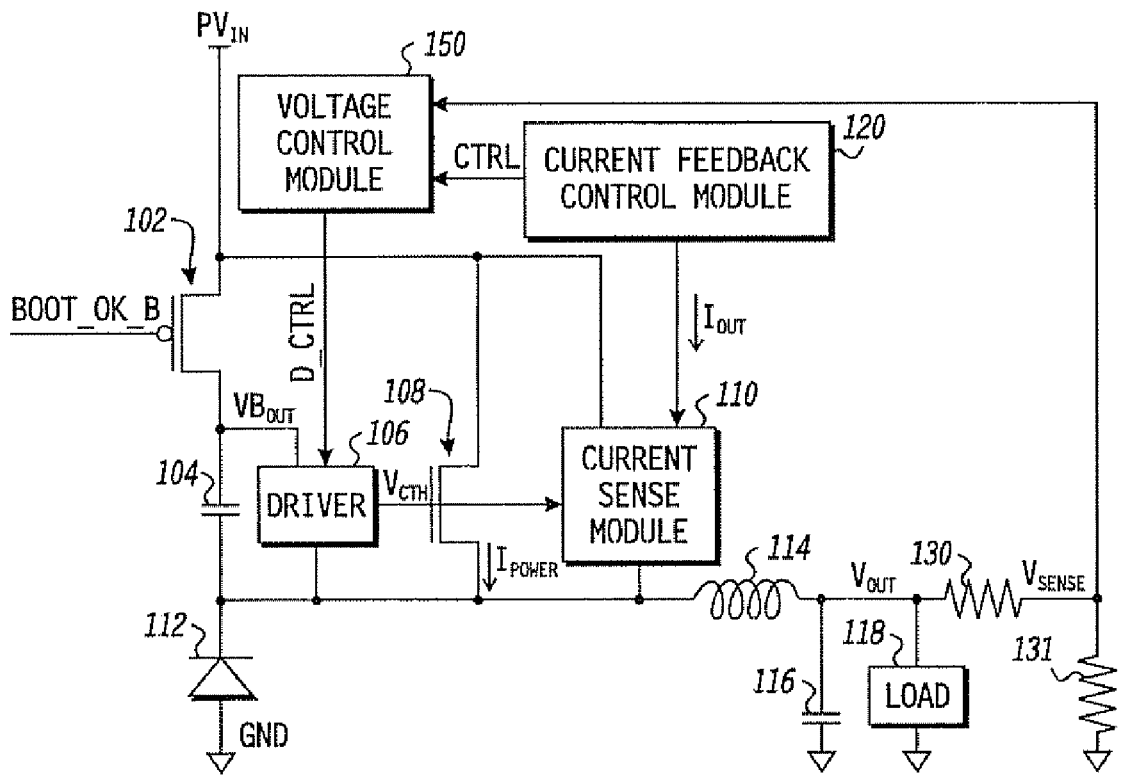
FIG. 1 illustrates a combined circuit and block diagram of a particular embodiment of a DC-DC converter.

FIG. 1 illustrates a particular embodiment of a combined circuit and block diagram of a DC-DC voltage converter 100 employing a current sensor. The DC-DC converter 100 includes a switch (transistor 102), a capacitor 104, a driver module 106, an n-type FET transistor 108, a current sense module 110, a diode 112, an inductor 114, a capacitor 116, a load 118, a feedback control module 120, a resistor 130, a resistor 131, and a voltage control module 150. The voltage control module 150 includes an input to receive a voltage labeled $V_{SENSE}$, an input to receive a signal CTRL, and an output to provide a control signal D_CTRL based upon the CTRL signal and the voltage $V_{SENSE}$. The switch 102 is illustrated to be a p-type transistor having a first current electrode connected to receive a voltage $PV_{IN}$, a second current electrode, and a control electrode to receive a control signal, labeled BOOT_OK_B. The capacitor 104 has a first electrode connected to the second current electrode of the switch 102 and a second electrode.

The driver module 106 has a first terminal connected to the second current electrode of the switch 102 to receive a signal labeled $V_{BOOT}$. The driver module 106 also has a second terminal connected to the second electrode of the capacitor 104, and a third terminal to provide a voltage labeled $V_{CTH}$. In addition, the driver module 106 has an input to receive the signal D_CTRL. The transistor 108 includes a first current electrode connected to receive the voltage $PV_{IN}$, a second current electrode connected to the second terminal of the driver module 106, and a control electrode connected to the third terminal of the driver module 106.

The current sense module 110 has a first terminal connected to receive the voltage $PV_{IN}$, a second terminal connected to the output of the driver module 106, a third terminal coupled to the second current electrode of the transistor 108, and a fourth terminal to receive a current $I_{OUT}$. The feedback control module 120 has a first terminal connected to the fourth terminal of the current sense module 110 and a terminal to provide the signal CTRL.

The diode 112 has a first electrode coupled to the second current electrode of the transistor 108 and a second electrode connected to a voltage reference, labeled GND. The inductor 114 has a first electrode connected to the second current electrode of the transistor 108 and a second electrode. The capacitor 116 has a first electrode connected to the second electrode of the inductor 114 and a second electrode connected to the GND voltage reference. The load 118 has a first terminal connected to the second terminal of the inductor 114 and a second terminal connected to the GND voltage reference. The resistor 130 has a first electrode coupled to the second electrode of the inductor 114 and a second electrode. The resistor 131 has a first electrode connected to the second current electrode of the resistor 130 and a second electrode connected to the GND voltage reference.

It will be appreciated that the currents illustrated and discussed in FIG. 1 can be positive or negative currents and that the terms "receive" and "provide" with respect to specific signals do not imply any specific direction of current flow.

The DC-DC voltage converter 100 regulates a voltage $V_{OUT}$ by sensing the current $I_{POWER}$ at the current sense module 110 to provide a feedback signal (CTRL) to the voltage control module 150. The voltage control module 150 monitors the voltage V_SENSE and, based on this voltage and the CTRL signal, applies the control signal D_CTRL to switch the driver module 106 on and off, thereby controlling when the current $I_{POWER}$ is applied. Accordingly, the feedback loop that includes the driver 106, the current sense module 110, the current feedback control module 120, and the voltage control module 150 regulates charging of the inductor 114 and the capacitor 116, which results in generation of a regulated DC voltage $V_{OUT}$ at the load 118. In addition, the current sense module 110 has a large output resistance relative to the resistive load of the feedback control module 120, so that varying the characteristics of the feedback control module 120 does not affect the sensed current.

The current sense module 110 senses the current $I_{POWER}$ to generate the current $I_{OUT}$. Based on the current $I_{OUT}$ the feedback control module 120 generates the CTRL signal to control a duty cycle of the D_CTRL signal at the voltage control module 150. In a particular embodiment, the voltage control module 150 uses a pulse width modulated (PWM) ramp generator (not shown) to generate a ramp whose slope is based on the CTRL signal. In another embodiment, the CTRL signal itself is a ramp signal. The voltage control module 150 generates the D_CTRL signal by comparing the generated or provided ramp signal to a threshold voltage and toggling the D_CTRL signal when the ramp meets the threshold. Accordingly, the duty cycle of the D_CTRL signal is based on the slope of the ramp based on the CTRL signal. Based on the duty cycle of the D_CTRL signal, the driver module 120 controls application of the voltage VCTH, thereby controlling the charging of the capacitor 116 and the inductor 114. Accordingly, by controlling the duty cycle of the D_CTRL signal based on the current $I_{OUT}$, the feedback control module 106 ensures that the level of the voltage $V_{OUT}$ does not exceed specified limits.

In addition, the duty cycle of the D_CTRL signal can be based on the voltage $V_{SENSE}$. The voltage $V_{SENSE}$ is proportional to the voltage $V_{OUT}$ as divided across the resistor 130 and the resistor 131. In a particular embodiment, the voltage $V_{SENSE}$ is used to establish the threshold voltage at the voltage control module 150 to which the ramp signal is compared, and therefore the duty cycle of the control signal D_CTRL is based in part on this threshold voltage. Thus, the voltage control module 150 can use both the feedback signals CTRL and $V_{SENSE}$ to control a duty cycle of the signal D_CTRL, thereby ensuring that the voltage $V_{OUT}$ remains within specified limits.

The switch 102 enables the voltage $PV_{IN}$ to charge the capacitor 104, thereby supplying the voltage $V_{BOOT}$ as a positive supply voltage for the driver module 106.

Figure 2:
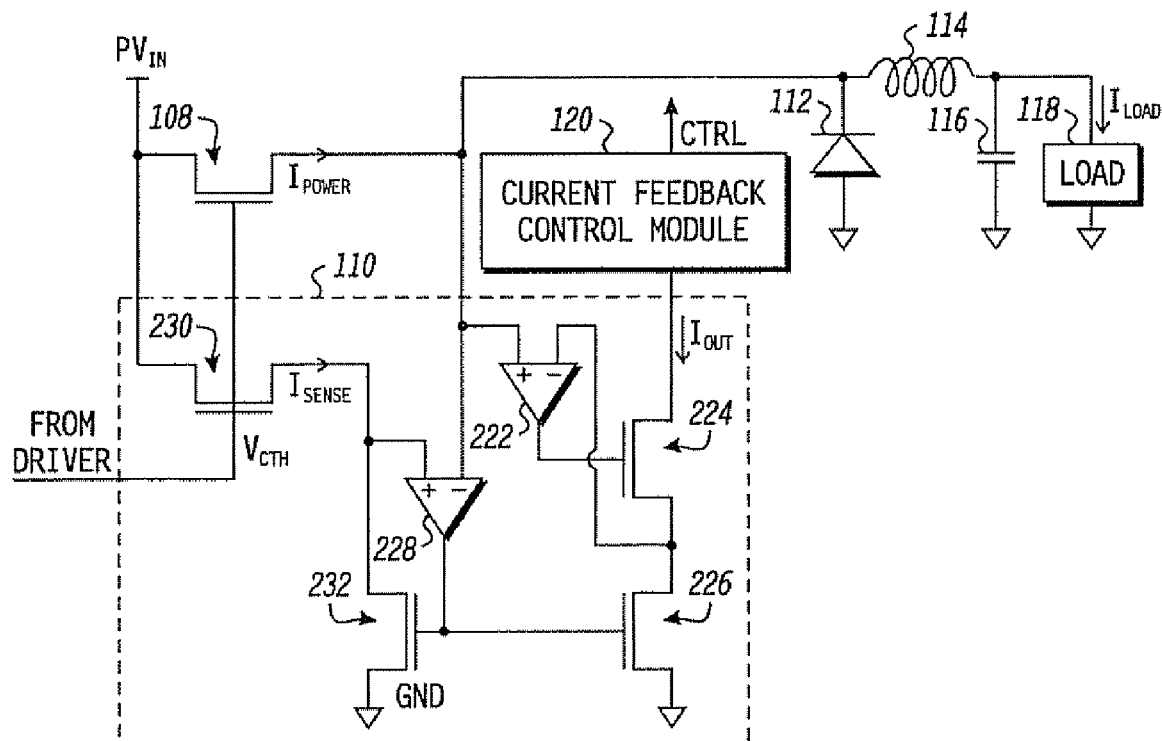
FIG. 2 illustrates a combined circuit and block diagram of portions of the DC-DC converter of FIG. 1.

Referring to FIG. 2, a combined circuit and block diagram of portions of the DC-DC converter of FIG. 1, including the current sense module 110, is illustrated. Elements of FIG. 2 common to FIG. 1 are commonly numbered. The current sense module 110 includes operational amplifiers 222 and 228, and n-type FET transistors 224, 226, 230, and 232.

The operational amplifier 228 has a positive input terminal, a negative input terminal coupled to the second current electrode of transistor 108, and an output terminal. The transistor 230 includes a first current electrode connected to the first current electrode of the transistor 108 to receive the voltage $PV_{IN}$, a second current electrode coupled to the positive input terminal of the operational amplifier 228, and a control electrode coupled to receive the control voltage $V_{CTH}$ from the driver module 106 (FIG. 1). The transistor 232 has a first current electrode coupled to the positive input terminal of the operational amplifier 228, a second current electrode connected to a voltage reference, labeled GND, and a control electrode coupled to the output terminal of the operational amplifier 228.

The operational amplifier 222 has a positive input terminal coupled to the negative input terminal of the operational amplifier 228, a negative input terminal, and output terminal. The transistor 224 has a first current electrode, a second current electrode coupled to the negative input terminal of the operational amplifier 222, and a control electrode connected to the output terminal of the operational amplifier 222. The transistor 226 has a first current electrode coupled to the negative input terminal of the operational amplifier 222, a second current electrode connected to the GND voltage reference, and a control electrode connected to the output terminal of the operational amplifier 228.

During operation, operational amplifier 228 has a sufficiently high open-loop voltage gain and high input resistance to ensure that a virtual short circuit is created across the input terminals. Therefore, a substantially common voltage is maintained at the input terminals of the operational amplifier 228. As a result of the virtual short circuit, a common voltage is applied at the second current electrode of the transistor 108 and at the second current electrode of the transistor 230. Therefore a common source-drain voltage is applied to transistors 108 and 230, as is a common gate voltage to ensure that the current $I_{SENSE}$ through transistor 230 is a proportional copy of the current $I_{POWER}$ through transistor 108. The current $I_{SENSE}$ can be smaller than the current $I_{POWER}$ by scaling the channel dimensions of transistor 230 relative to the channel dimensions of transistor 108. Thus, the transistor 230 is employed as a sense transistor to sense the current through the transistor 108.

The operational amplifier 222 also has sufficiently high open-loop voltage gain and high input resistance to cause a virtual short circuit across its input terminals. As a result of the virtual short circuit between the input terminals, a common voltage is applied at the first current electrode of transistor 232 and the first current electrode of the transistor 226. Accordingly, transistors 232 and 226 form a current mirror where the current through transistor 226 is the same as the current through transistor 232. Therefore, since the current through transistor 232 matches the sensed current $I_{SENSE}$, so does the current $I_{OUT}$ through transistor 226.

In addition, the gain of the operational amplifier 222 boosts the output resistance seen at the first current electrode of the transistor 224, as set forth in the following formula:

$$R_{OUT} = R_{226} \times g_{224} \times R_{224} \times A_{222}$$

where $R_{OUT}$ is the output resistance seen at the first current electrode of transistor 224, $R_{224}$ and $R_{226}$ are the respective output resistances for the transistor 224 and the transistor 226, $g_{224}$ is the transconductance of the transistor 224 as seen through its second current terminal, and $A_{222}$ is the open loop gain of the op-amp 222. Thus, because the value of $A_{222}$ is relatively large, the output resistance of the current sense module 110 is relatively large as compared with the resistive load of the feedback control module 120. Accordingly, the current $I_{OUT}$ is substantially independent of the resistive load of the feedback control module 120, allowing the current sense module 220 to provide accurate current sensing when variations in resistance occur at the feedback control module 120. This is advantageous, since the resistance of the feedback control module can vary during operation, or due to process variations during manufacturing.

As indicated above, the current $I_{SENSE}$ can be scaled by scaling the channel dimensions of the transistor 230. In a particular embodiment, the channel width of the transistor 230 is expressed as follows:

$$W_{230} = \frac{W_{108}}{N}$$

where $W_{230}$ is the channel width of the transistor 230, $W_{108}$ is the channel width of the transistor 108, and N is a scale factor. In addition, the channel lengths for the transistor 230 and the transistor 108 are approximately equal. Accordingly, the current $I_{OUT}$ is expressed as follows:

$$I_{OUT} = I_{SENSE} = \frac{I_{POWER}}{N}$$

Thus, the current $I_{OUT}$ is an accurate proportional representation of the current $I_{POWER}$.

Figure 3:
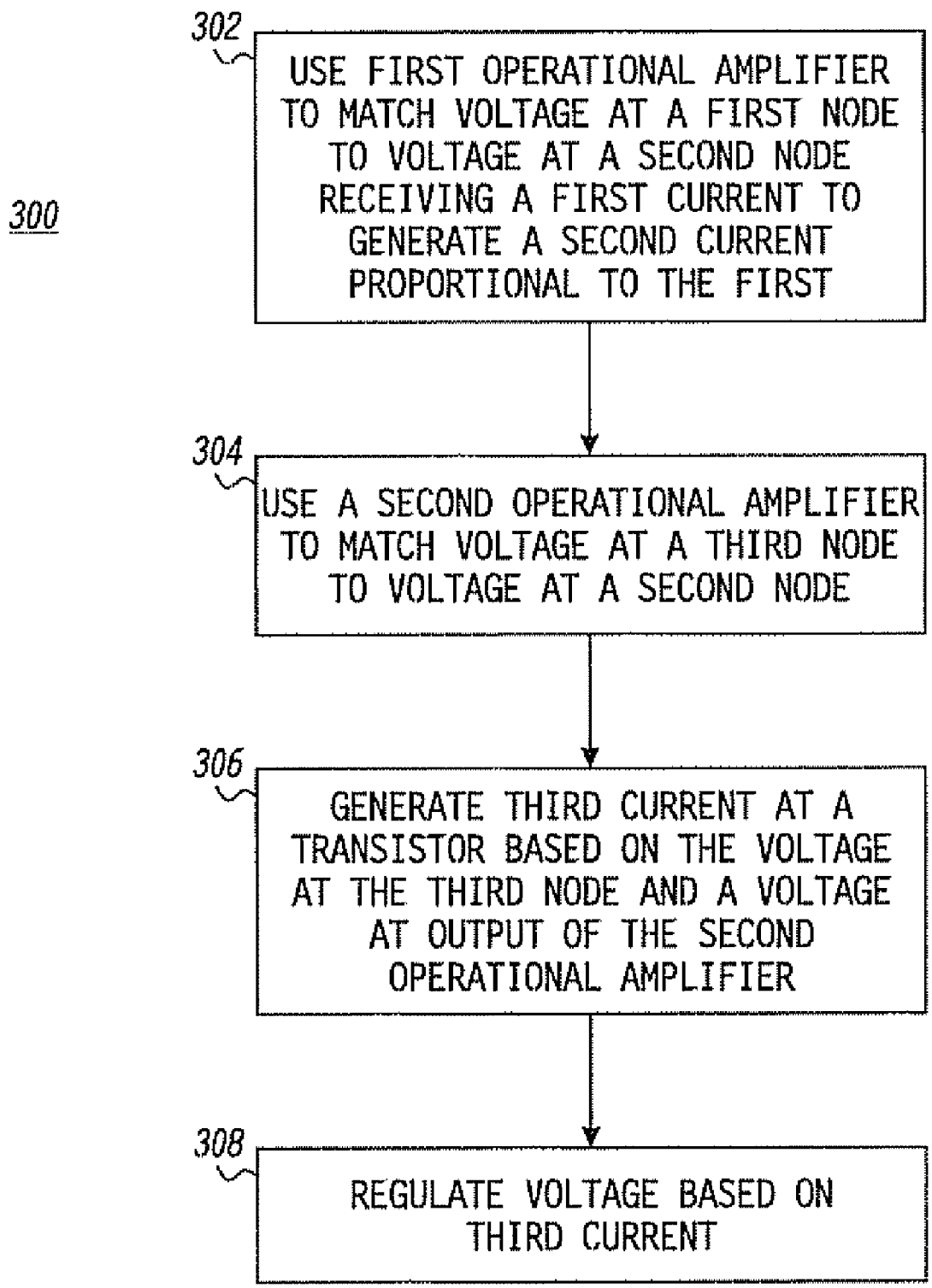
FIG. 3 illustrates a flow chart of a method for sensing a current in a DC-DC converter.

Referring to FIG. 3, the figure illustrates a flow chart 300 of a method for regulating a voltage based on a sensed current. At block 302 a first operational amplifier is used to match a voltage at a second node to a voltage at a first node. In a particular embodiment, the first node is connected to a first input of the first operational amplifier and the second node is connected to a second input of the first operational amplifier. The first node receives a first current and provides at least a portion of the first current to a load. By using the operational amplifier to match the voltages, a second current proportional to the first current is generated.

At block 304, a second operational amplifier is used to match a voltage at a third node to a voltage at the second node. In a particular embodiment, the second node is connected to a first input of the second operational amplifier and the third node is connected to a second input of the second operational amplifier.

At block 306, a third current is generated at a transistor. The third current is based on the voltage at the third node and a voltage at the output of the second operational amplifier. At block 308, a voltage provided to the load is regulated based on the third current.

Other embodiments, uses, and advantages of the disclosure will be apparent to those skilled in the art from consideration of the specification and practice of the disclosure disclosed herein. For example, although the device described herein has been illustrated as employing transistors of a particular polarity type, it will be appreciated that transistors of other polarity types can be used. The specification and drawings should be considered exemplary only, and the scope of the disclosure is accordingly intended to be limited only by the following claims and equivalents thereof.

What is claimed is:

1. A device comprising:
   a first transistor comprising a first current electrode, a second current electrode, and a control electrode to receive a first control signal;
   a first operational amplifier comprising a first input terminal coupled to the second current electrode of the first transistor, a second input terminal, and an output terminal; and
   a second operational amplifier comprising a first input terminal coupled to the second input terminal of the first operational amplifier a second input terminal, and an output terminal;
   a second transistor comprising a first current electrode, a second current electrode coupled to the second input terminal of the second operational amplifier, and a control electrode coupled to the output of the second operational amplifier; and
   a feedback control module coupled to the first current electrode of the second transistor, the feedback control module configured to provide a second control signal based on a current through the second transistor, the first control signal based on the second control signal.

2. The device of claim 1, further comprising a third transistor comprising a first current electrode coupled to the second current electrode of the second transistor, a second current electrode coupled to the first voltage reference, and a control electrode coupled to the output terminal of the first operational amplifier.

3. The device of claim 2, further comprising a fourth transistor comprising a first current electrode coupled to the first input terminal of the first operational amplifier, a second current electrode coupled to a first voltage reference, and a control electrode coupled the output terminal of the first operational amplifier.

4. The device of claim 1, further comprising a fourth transistor comprising a first current electrode coupled to the first current electrode of the first transistor, a second current electrode coupled to the second current electrode of the first transistor, and a control electrode to receive the first control signal.

5. The device of claim 4, further comprising an inductor comprising a first terminal coupled to the second current electrode of the fifth transistor and a second terminal coupled to a load.

6. A voltage converter, comprising:
   a power switch;
   a control circuit including an output to provide a control signal to control the conductivity of the power switch; and
   a current sensor having an input to receive the control signal and an output to provide a signal to the control circuit, the current sensor comprising:
   a first transistor (230) comprising a first current electrode, a second current electrode, and a control electrode to receive the control signal;
   a first operational amplifier (228) comprising a first input terminal coupled to the second current electrode of the first transistor, a second input terminal, and an output terminal;
   a second operational amplifier (222) comprising a first input terminal coupled to the second input terminal of the first operational amplifier, a second input terminal, and an output terminal;
   a second transistor (232) comprising a first current electrode coupled to the first input terminal of the first operational amplifier, a second current electrode coupled to a first voltage reference, and a control electrode coupled to the output terminal of the first operational amplifier; and
   a third transistor (226) comprising a first current electrode coupled to the second input terminal of the second operational amplifier, a second current electrode coupled to the first voltage reference, and a control electrode coupled to the output terminal of the first operational amplifier.

7. The voltage converter of claim 6, wherein the current sensor further comprises:
   a fourth transistor (224) comprising a first current electrode to provide the signal to the control circuit, a second current electrode coupled to the second input terminal of the second operational amplifier, and a control electrode coupled to the output terminal of the second operational amplifier.

8. The voltage converter of claim 6 further comprising:
   a diode comprising a first electrode coupled to the second input terminal of the first operational amplifier, and a second electrode coupled to the first voltage reference.

9. The voltage converter of claim 6 further comprising:
   an inductor comprising a first electrode coupled to the second input terminal of the first operational amplifier, and a second electrode.

10. The voltage converter of claim 9 further comprising:
    a first capacitor comprising a first electrode coupled to the second electrode of the inductor, and a second electrode coupled to the first voltage reference.

11. The voltage converter of claim 9 further comprising:
a load comprising a first terminal coupled to the second electrode of the inductor, and a second terminal coupled to the first voltage reference.

12. The voltage converter of claim 11, further comprising:
a first resistor comprising a first electrode coupled to the second electrode of the inductor and a second electrode;
a second resistor comprising a first electrode coupled to the second electrode of the first resistor and a second electrode coupled to the first voltage reference.

13. The voltage converter of claim 6, wherein the control circuit further comprises:
a driver module comprising a first terminal coupled to provide the control signal, a second terminal, and a third terminal.

14. The device of claim 13 further comprising:
a fourth transistor (102) comprising a first current electrode coupled to the first current electrode of the first transistor, a second current electrode coupled to the second terminal of the driver, and a control electrode.

15. The device of claim 13 further comprising:
a capacitor comprising a first electrode coupled to the second terminal of the driver, and a second electrode coupled to the third terminal of the driver.

16. A method, comprising:
receiving a first current at a first node connected to a first input of an operational amplifier, wherein at least a portion of the first current is to drive a load;
matching a voltage at a second node to a voltage at the first node to generate a second current proportional to the first current, wherein the second node is connected to a second input of the first operational amplifier;
matching a voltage at a third node to the voltage at the second node, wherein the second node is connected to a first input of a second operational amplifier and the third node is connected to a second input of the second operational amplifier; and
generating a third current at a transistor based on the voltage at the third node and a voltage at an output of the second operational amplifier.

17. The method of claim 16 further comprising applying a voltage to the load based on the first current.

18. The method of claim 17 further comprising regulating the voltage based on the third current.

19. The method of claim 18, further comprising regulating the voltage based on a portion of the voltage.

20. The method of claim 19, further comprising regulating the voltage by controlling the conductivity of a switch.

\* \* \* \* \*